(12) United States Patent
Kojima

(10) Patent No.: US 12,315,701 B2
(45) Date of Patent: May 27, 2025

(54) FILM FORMING APPARATUS

(71) Applicant: TOKYO ELECTRON LIMITED, Tokyo (JP)

(72) Inventor: Yasuhiko Kojima, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/350,410

(22) Filed: Jul. 11, 2023

(65) Prior Publication Data

US 2024/0021415 A1 Jan. 18, 2024

(30) Foreign Application Priority Data

Jul. 15, 2022 (JP) .................................. 2022-114360

(51) Int. Cl.
*H01J 37/32* (2006.01)
*C23C 14/34* (2006.01)

(52) U.S. Cl.
CPC ........ *H01J 37/32477* (2013.01); *C23C 14/34* (2013.01); *H01J 37/32183* (2013.01); *H01J 2237/332* (2013.01)

(58) Field of Classification Search
CPC .............. H01J 37/3438; H01J 37/3444; H01J 37/3441; H01J 37/3447

USPC ....................... 204/298.06, 298.11
See application file for complete search history.

(56) References Cited

U.S. PATENT DOCUMENTS

| | | | |
|---|---|---|---|
| 8,298,385 B2 * | 10/2012 | Wong | H01L 21/28052 |
| | | | 204/298.08 |
| 2015/0114835 A1 * | 4/2015 | Gomi | H01J 37/3447 |
| | | | 204/298.08 |
| 2016/0351404 A1 * | 12/2016 | Aramaki | H01J 37/32715 |
| 2020/0126763 A1 * | 4/2020 | Sekiya | H01L 21/3065 |

FOREIGN PATENT DOCUMENTS

JP 2015-029532 A 2/2015

\* cited by examiner

*Primary Examiner* — Rodney G McDonald
(74) *Attorney, Agent, or Firm* — Fenwick & West LLP

(57) ABSTRACT

A film forming apparatus comprises a processing chamber connected to a ground potential, a holder configured to hold a target, a DC power supply configured to apply a DC voltage to the holder and an anti-adhesion shield disposed to surround the target and supported by the processing chamber through an insulating member. An impedance matcher is connected to the anti-adhesion shield and an RF power supply is connected to the impedance matcher.

5 Claims, 2 Drawing Sheets

FILM FORMING APPARATUS

CROSS-REFERENCE TO RELATED APPLICATIONS

This application claims priority to Japanese Patent Application No. 2022-114360, filed on Jul. 15, 2022, the entire contents of which are incorporated herein by reference.

TECHNICAL FIELD

The present disclosure relates to a film forming apparatus.

BACKGROUND

Japanese Laid-open Patent Publication No. 2015-29532 discloses a film forming apparatus including: a processing chamber; an exhaust device for depressurizing an inside of the processing chamber; a mounting table for mounting an object to be processed and provided in the processing chamber; first and second targets provided above the mounting table and made of a first insulating material; a gas supply for supplying gas into the processing chamber; a first high frequency power supply for generating first high frequency power for causing positive ions in the gas supplied from the gas supply to collide with the first target; a second high frequency power supply for generating second high frequency power for causing positive ions in the gas supplied from the gas supply to collide with the second target; and a phase adjuster for adjusting a phase difference between the first high frequency power and the second high frequency power.

SUMMARY

In one aspect, the present disclosure provides a film forming apparatus that stably forms a film.

One aspect of the present disclosure provides a film forming apparatus, comprising: a processing chamber connected to a ground potential; a holder configured to hold a target; a DC power supply configured to apply a DC voltage to the holder; an anti-adhesion shield disposed to surround the target and supported by the processing chamber through an insulating member; an impedance matcher connected to the anti-adhesion shield; and an RF power supply connected to the impedance matcher.

DETAILED DESCRIPTION

Figure 1:
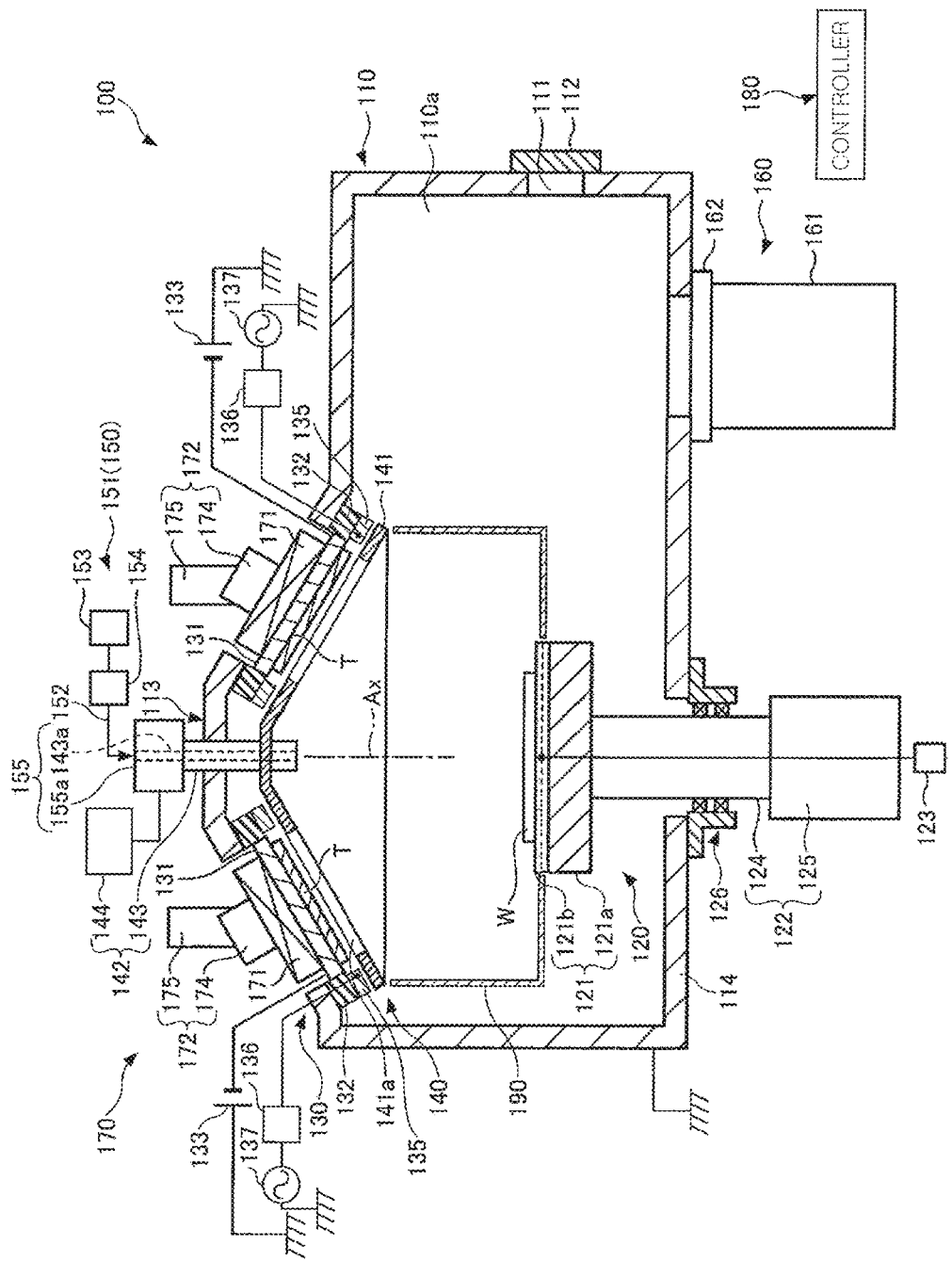
FIG. 1 is an example of a schematic cross-sectional view of a film forming apparatus according to an embodiment.

Hereinafter, embodiments of the present disclosure will be described with reference to the drawings. In each drawing, the same components are denoted by the same reference numerals, and redundant description may be omitted.

A film forming apparatus (a substrate processing apparatus, a sputtering apparatus) 100 will be described with reference to FIG. 1. FIG. 1 is an example of a schematic cross-sectional view of the film forming apparatus 100 according to an embodiment. The film forming apparatus 100 is a PVD (Physical Vapor Deposition) apparatus, and is a sputtering apparatus for forming a film by adhering (depositing) sputter particles (film forming atoms) emitted from targets T1 and/or T2 onto a surface of a substrate W such as a semiconductor wafer mounted on a mounting table 121 in a processing chamber 110.

The film forming apparatus 100 includes the processing chamber 110 having an internal space 110a for performing film formation processing onto the substrate W. In addition, the film forming apparatus 100 has a configuration for performing film formation processing onto the substrate W within the processing chamber 110, and includes a stage mechanism 120, a target holder 130, a target cover 140, a gas supply 150, a gas exhauster 160, and a magnet mechanism 170. Further, the film forming apparatus 100 has a controller 180 that controls an operation of each component.

The processing chamber 110 included in the film forming apparatus 100 is made of, for example, aluminum. The processing chamber 110 is connected to a ground potential. In other words, the processing chamber 110 is grounded. The processing chamber 110 includes a loading/unloading port 111 that communicates the internal space 110a with an outside of the processing chamber 110, and a gate valve 112 that opens and closes the loading/unloading port 111. When the gate valve 112 is opened, the film forming apparatus 100 loads and unloads the substrate W through the loading/unloading port 111 by a transport device (not shown).

The processing chamber 110 is positioned at the center of film formation processing on the substrate W in the internal space 110a and has a processing center axis Ax extending along a vertical direction. The processing central axis Ax is set so as to pass through the center of the substrate W mounted on the stage mechanism 120. In addition, the processing chamber 110 has a pyramid portion 113 having a substantially pyramid shape (for example, a substantially quadrangular pyramid shape, a conical shape, or the like) on a ceiling located above the stage mechanism 120. The processing central axis Ax is configured to pass through the center (apex) of the pyramid portion 113.

The stage mechanism 120 includes a mounting table 121 disposed within the processing chamber 110, and a support driver 122 that operably supports the mounting table 121. The mounting table 121 includes a substantially disk-shaped base 121a and an electrostatic chuck 121b fixed on the base 121a.

The base 121a is made of, for example, aluminum. The base 121a is fixed to an upper end of the support driver 122. By moving the base 121a by the support driver 122, the electrostatic chuck 121b is disposed at a predetermined height position of the internal space 110a. In addition, the stage mechanism 120 may include a temperature control mechanism (not shown) that adjusts a temperature of the base 121a to control a temperature of the substrate W mounted on the mounting table 121.

The electrostatic chuck 121b includes a dielectric film and an electrode provided in an inner layer of the dielectric film (both not shown). A DC power supply 123 is connected to the electrode of the electrostatic chuck 121b. The electrostatic chuck 121b electrostatic-suctions the substrate W mounted on an upper surface of the electrostatic chuck 121b by generating an electrostatic force in the dielectric film by a DC voltage supplied to the electrode from the DC power supply 123. The center of the upper surface of the electrostatic chuck 121b (the mounting surface of the substrate W) coincides with the processing central axis Ax.

The support driver 122 has a columnar support shaft 124 that holds the base 121a, and an operating device 125 that operates the support shaft 124. The support shaft 124 extends in a vertical direction and extends from the inner space 110a of the processing chamber 110 to an outside of the processing chamber 110 through a bottom 114. The shaft center of the support shaft 124 overlaps with the processing central axis Ax.

The operating device 125 is provided outside the processing chamber 110. The operating device 125 holds a lower end side of the support shaft 124. The operating device 125 rotates the support shaft 124 around the processing central axis Ax based on the control of the controller 180. In addition, the operating device 125 raises and lowers (up and down movement) the mounting table 121 in a vertical direction. The mounting table 121 rotates and moves up and down within the processing chamber 110 by the operation of the operating device 125.

In addition, the stage mechanism 120 includes a sealing structure 126 that seals the gap between the bottom 114 of the processing chamber 110 and the support shaft 124 while making the support shaft 124 operable. For example, a magnetic fluid seal may be applied as the sealing structure 126.

The target holder 130 of the film forming apparatus 100 holds a plurality of targets T, which are cathode targets, at positions spaced upward from the mounting table 121. The film forming apparatus 100 shown in FIG. 1 includes two target holders 130. The target holder 130 includes a metal holder 131 that holds each of the plurality of targets T, and an insulating member 132 that fixes an outer peripheral of the plurality of holders 131 to support the holder 131.

The targets T respectively held by the holder 131 are made of a material having a substance for film formation. Each of the targets T is a rectangular flat plate. In addition, the film forming apparatus 100 may include the targets T made of different types of materials. For example, a multilayer film may be formed in the processing chamber 110 by switching and sputtering each of the targets T made of a plurality of different materials. In other words, the film forming apparatus 100 may perform simultaneous sputtering (co-sputtering) for simultaneously film-forming a plurality of targets.

The film forming apparatus 100 according to an embodiment forms a high resistance film (insulating film) on the substrate W as an example of film formation processing. In an embodiment of the present disclosure, as examples of forming the high resistance film on the substrate W, a silicon (Si) film, an indium gallium zinc oxide (IGZO) film, or the like is formed.

Each of the holders 131 is formed in a rectangular shape that is one size larger than the targets T in a plan view. Each of the holders 131 is fixed to an inclined surface of the pyramid portion 113 through the insulating member 132. Since each of the holders 131 is fixed to the inclined surface of the pyramid portion 113, each of the holders 131 holds the surfaces of the plurality of targets T (sputter surfaces exposed in the internal space 110a) in an inclined state with respect to the processing central axis Ax.

In addition, the target holder 130 electrically connects a DC power supply 133 to the targets T held by the respective holders 131. Each of the plurality of DC power supplies 133 applies a negative DC voltage to the target T connected thereto. In addition, the DC power supply 133 may be a single power supply that selectively applies a voltage to each of the plurality of targets T.

In addition, a metal target shield (anti-adhesion shield) 135 is provided so as to surround the target T held by the holder 131. The target shield 135 has an opening through which the target T is exposed, and is fixed to an inclined surface of the pyramid portion 113 through the insulating member 132. In other words, the insulating member 132 is provided between the processing chamber 110 connected to the ground potential and the target shield 135. Thereby, the target shield 135 is not electrically connected to the processing chamber 110 and may be set to a potential different from the ground potential. In addition, the target shield 135 and the holder 131 are not electrically connected.

In addition, a Radio Frequency (RF) power supply 137 is connected to the target shield 135 via an impedance matcher 136. The RF power supply 137 has one end connected to the ground potential and the other end connected to the impedance matcher 136. The RF power supply 137 supplies weak RF power to the target shield 135 via the impedance matcher 136. Herein, the RF power applied by the RF power supply 137 has a frequency within a range of, for example, 400 kHz or more and 100 MHz or less, and is preferably 50 W or more and 10 kW or less.

The impedance matcher 136 is provided between the RF power supply 137 and the target shield 135. Herein, the sputter particles of the high resistance material emitted from the target T adhere to the substrate W and form a film, and also adhere to the target shield 135, forming a high resistance film on the surface of the target shield 135. The impedance matcher 136 performs impedance matching so that the electrical resistance of the target shield 135 and the high resistance film formed on the target shield 135 is reduced (or to be nearly zero) in an electrical circuit in which current (electrons) flows from plasma to a set potential.

The target cover 140 of the film forming apparatus 100 has a shutter main body 141 disposed within the processing chamber 110 and a shutter driver 142 supporting the shutter main body 141 in an operable manner.

The shutter main body 141 is provided between the plurality of targets T and the mounting table 121. The shutter main body 141 is formed in a pyramid shape substantially parallel to an inclined surface of the pyramid portion 113 of the processing chamber 110. The shutter main body 141 may face sputter surfaces of the plurality of targets T. The shutter main body 141 also has one opening 141a that is slightly larger than the targets T.

The opening 141a is disposed to face one target T (selected target Ts) among the plurality of targets T by the shutter driver 142. By disposing the opening 141a facing the selected target Ts, the shutter main body 141 exposes only the selected target Ts to the substrate W of the mounting table 121. Then, the shutter main body 141 does not expose other target T (non-selected target Tns).

The shutter driver 142 includes a columnar rotary shaft 143 and a rotating portion 144 that rotates the rotary shaft 143. The axis of the rotary shaft 143 overlaps with the processing central axis Ax of the processing chamber 110. The rotary shaft 143 extends along a vertical direction and fixes the center (apex) of the shutter main body 141 at its lower end. The rotary shaft 143 protrudes outside the processing chamber 110 through the center of the pyramid portion 113.

The rotating portion 144 is provided outside the processing chamber 110, and rotates the rotary shaft 143 relative to an upper end (connector 155a) holding the rotary shaft 143 through a rotation transmission portion (not shown). As a result, the rotary shaft 143 and the shutter main body 141 rotate around the processing central axis Ax. Accordingly, the target cover 140 may adjust a circumferential position of the opening 141a based on the control of the controller 180, and may make the opening 141a face the selected target Ts to be sputtered.

In addition, although the film forming apparatus 100 performs sputtering while switching therebetween using the target cover 140, the sputtering may be performed simultaneously without providing the target cover 140 in the film forming apparatus 100.

The gas supply 150 of the film forming apparatus 100 includes an excitation gas portion 151 that is provided in the pyramid portion 113 and supplies an excitation gas.

The excitation gas portion 151 includes a pipe 152 for circulating gas outside the processing chamber 110. The excitation gas portion 151 also includes a gas source 153, a flow controller 154, and a gas introduction portion 155 in order from an upstream side to a downstream side of the pipe 152.

The gas source 153 stores an excitation gas (for example, argon gas). The gas source 153 supplies gas to the pipe 152. A mass flow controller or the like is applied to the flow controller 154, for example, and adjusts a flow rate of the gas supplied into the processing chamber 110. The gas introduction portion 155 introduces gas from the outside of the processing chamber 110 into the inside. The gas introduction portion 155 is configured of a connector 155a connected to the pipe 152 outside the processing chamber 110, and a gas passage 143a formed in the rotary shaft 143 of the target cover 140.

The gas exhauster 160 provided in the film forming apparatus 100 includes a decompression pump 161, and an adapter 162 for fixing the decompression pump 161 to the bottom 114 of the processing chamber 110. The gas exhauster 160 decompresses the internal space 110a of the processing chamber 110 under the control of the controller 180.

The magnet mechanism 170 provided in the film forming apparatus 100 applies a magnetic field H to each of the targets T. The magnet mechanism 170 applies the magnetic field H to each of the targets T, so that the magnet mechanism 170 induces plasma to the targets T. The magnet mechanism 170 includes a magnet 171 (cathode magnet) and an operation portion 172 that operably holds the magnet 171 for each of the plurality of holders 131. The film forming apparatus 100 according to an embodiment has two magnets 171 and two operation portions 172 holding each of the magnets 171 corresponding to the two holders 131.

Each of the magnets 171 is formed in the same shape. Further, each of the magnets 171 generates magnetic force of the same degree as each other. Specifically, each of the magnets 171 has a substantially rectangular shape in a plan view. In the holding state of the operation portion 172, a long side of the magnet 171 is extended parallel to a lateral direction of the rectangular-shaped target T, while a short side of the magnet 171 is extended parallel to a longitudinal direction of the rectangular-shaped target T.

Each of the magnets 171 may apply a permanent magnet. The material forming each of the magnets 171 is not particularly limited as long as it has an appropriate magnetic force, and examples thereof include iron, cobalt, nickel, samarium, and neodymium.

The operation portion 172 holding each of the magnets 171 reciprocates the held magnets 171 along a longitudinal direction of the targets T. In other words, the magnet 171 is provided movably. Further, the operation portion 172 holding each of the magnets 171 separates and approaches the held magnets 171 from the targets T. Specifically, each of the operation portions 172 includes a reciprocating mechanism 174 that holds the magnet 171 and reciprocates the magnet 171, and a contact and separation mechanism 175 that holds the reciprocating mechanism 174 and moves the reciprocating mechanism 174 away from and close to the targets T.

The controller 180 is composed of a computer and controls each component of the film forming apparatus 100. The controller 180 has a main controller composed of a CPU that actually performs these controls, an input device, an output device, a display device, and a storage device. The storage device stores parameters of various processes executed in the film forming apparatus 100, and a storage medium in which a program, i.e., a processing recipe, for controlling the processes executed by the film forming apparatus 100 is stored is set. The main controller of the controller 180 calls a predetermined processing recipe stored in the storage medium, and causes the film forming apparatus 100 to execute a predetermined process based on the processing recipe.

In addition, a substantially cylindrical chamber shield 190 is provided within the processing chamber 110. The chamber shield 190 forms the sidewall of the processing space from which sputter particles are emitted. In addition, the chamber shield 190 may be connected to the ground potential in the same way as the processing chamber 110.

Next, an example of film formation processing using the film formation apparatus 100 will be described. In addition, the inside of the processing chamber 110 is vacuum exhausted to a predetermined vacuum level by the exhauster 160.

First, the controller 180 prepares the substrate W on the mounting table 121. Specifically, the controller 180 opens the gate valve 112. The substrate W is loaded into the processing chamber 110 through the loading/unloading port 111 by a transport device (not shown) and mounted on the mounting table 121. The controller 180 controls a power supply (not shown) of the electrostatic chuck 121b to electrostatic-suction the substrate W to the mounting table 121. When the transport device retreats from the loading/unloading port 111, the controller 180 closes the gate valve 112. Further, the controller 180 controls the support driver 122 to raise the mounting table 121 to a predetermined height position. Thus, the mounting table 121 and the chamber shield 190 form a processing space from which sputter particles are emitted.

Next, the controller 180 performs film formation processing on the substrate W. Specifically, the controller 180 controls the support driver 122 to rotate the mounting table 121 holding the substrate W thereon. The controller 180 also controls the flow controller 154 to supply an excitation gas (for example, argon gas) into the processing chamber 110. Further, the controller 180 controls the DC power supply 133 to apply a negative DC voltage to the holder 131 holding the targets T. As a result, ions in the excitation gas dissociated around the targets T collide with the targets T, and sputter particles are emitted from the targets T into the internal space 110a. As a result, sputter particles adhere (deposit) to the substrate W, and a film is formed on the substrate W.

Further, during the film formation processing, the controller 180 controls the operation portion 172 to swing (reciprocate) the magnet 171. Thereby, plasma is induced by the magnetic field of the magnet 171. In other words, by controlling the swing width of the magnet 171, the sputter electrical discharge regions of the targets T are controlled.

When the film formation processing is completed, the controller 180 controls the flow controller 154 to stop supplying an excitation gas. In addition, the controller 180 controls the DC power supply 133 to stop applying voltage to the holder 131. Further, the controller 180 controls the support driver 122 to stop the rotation of the mounting table 121. Next, the controller 180 controls the support driver 122 to lower the mounting table 121 to a predetermined position. Further, the controller 180 controls the power supply (not shown) of the electrostatic chuck 121b to release electrostatic adsorption. The controller 180 opens the gate valve 112. The substrate W is unloaded from the processing chamber 110 through the loading/unloading port 111 by the transport device (not shown). When the transport device retreats from the loading/unloading port 111, the controller 180 closes the gate valve 112.

As described above, the film forming apparatus 100 emits sputter particles from the targets T, adheres the sputter particles to the surface of the substrate W, and forms a film.

In addition, the target shield 135 is disposed around the target T in the film forming apparatus 100 that applies a negative DC voltage to the holder 131. The target shield 135 is supplied with weak RF power from the RF power supply 137 via the impedance matcher 136.

Herein, the sputter particles of the high resistance material emitted from the target T adhere to the target shield 135 and a high resistance film is formed on the surface of the target shield 135. The impedance matcher 136 performs impedance matching so that the electrical resistance of the target shield 135 and the high resistance film formed on the target shield 135 is reduced (or to be nearly zero) in an electrical circuit in which current (electrons) flows from plasma to a set potential through the target shield 135.

As a result, electrons that have reached the target shield 135 from the plasma generated around the target T may pass through the high resistance film and reach the ground potential.

Accordingly, even though a high resistance film is formed on the surface of the target shield 135, it is possible to suppress an increase in electrical resistance of current flowing from the plasma to the ground potential through the target shield 135. Accordingly, even after the high resistance film is formed on the surface of the target shield 135, the state of the plasma around the target T may be made the same as before the formation of the high resistance film.

In addition, the state of the plasma around the target T may be made stable over a long period of time. As a result, the film formation rate and in-plane uniformity of the film formed on the substrate W may be stabilized over a long period of time.

Further, although the chamber shield 190 has been described as being connected to the ground potential, it is not limited thereto, and may be configured to be connected to the RF power supply 137 via the impedance matcher 136 like the target shield 135. Thereby, the plasma state may be made more stable.

Figure 2:
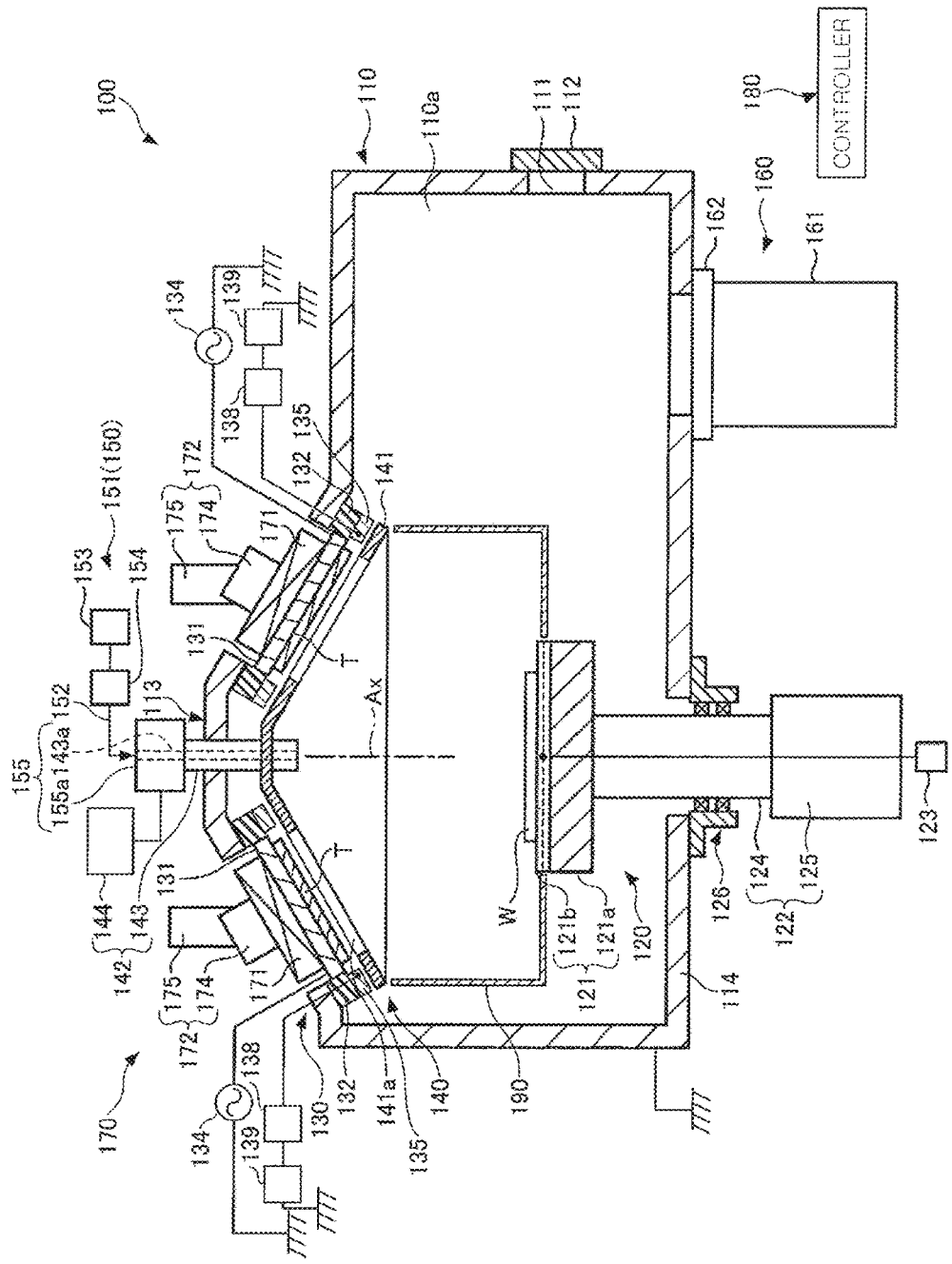
FIG. 2 is an example of a schematic cross-sectional view of a film forming apparatus according to another embodiment.

Next, the film forming apparatus 100 according to another embodiment will be described with reference to FIG. 2. FIG. 2 is an example of a schematic cross-sectional view of the film forming apparatus 100 according to another embodiment.

The target holder 130 electrically connects an RF power supply 134 to the targets T held by the respective holders 131. Each of the plurality of RF power supplies 134 applies an RF voltage to the target T connected thereto. In addition, the RF power supply 134 may be a single power supply that selectively applies an RF voltage to each of the plurality of targets T.

In addition, the metal target shield 135 is provided so as to surround the target T held by the holder 131. The target shield 135 is fixed to an inclined surface of the pyramid portion 113 through the insulating member 132. In other words, the insulating member 132 is provided between the processing chamber 110 connected to the ground potential and the target shield 135. Thereby, the target shield 135 is not electrically connected to the processing chamber 110 and may be set to a potential different from the ground potential. In addition, the target shield 135 and the holder 131 are not electrically connected.

In addition, a capacitor 139 is connected to the target shield 135 via a variable coil 138. The capacitor 139 has one end connected to the ground potential and the other end connected to the variable coil 138. The variable coil 138 is provided between the capacitor 139 and the target shield 135. The inductance of the variable coil 138 is adjusted so that the electrical resistance of the target shield 135 and the high resistance film formed on the target shield 135 is reduced (or to be nearly zero) in an electrical circuit in which current (electrons) flows from plasma to a set potential through the target shield 135.

Other configurations are the same as those of the film forming apparatus 100 shown in FIG. 1, and redundant descriptions are omitted.

Herein, the sputter particles of the high resistance material emitted from the target T adhere to the target shield 135 and form a high resistance film on the surface of the target shield 135. The inductance of the variable coil 138 is adjusted so that the electrical resistance of the target shield 135 and the high resistance film formed on the target shield 135 is reduced (or to be nearly zero) in an electrical circuit in which current (electrons) flows from plasma to a set potential.

As a result, electrons that have reached the target shield 135 from the plasma generated around the target T may pass through the high resistance film and reach the ground potential.

Accordingly, even though a high resistance film is formed on the surface of the target shield 135, it is possible to suppress an increase in electrical resistance of current flowing from the plasma to the ground potential through the target shield 135. Accordingly, even after the high resistance film is formed on the surface of the target shield 135, the state of the plasma around the target T may be made the same as before the formation of the high resistance film.

In addition, the state of the plasma around the target T may be made stable over a long period of time. As a result, the film formation rate and in-plane uniformity of the film formed on the substrate W may be stabilized over a long period of time.

Further, although the chamber shield 190 has been described as being connected to the ground potential, it is not limited thereto, and may be configured to be connected to the capacitor 139 via the variable coil 138 like the target shield 135. Thereby, the plasma state may be made more stable.

It should be noted that other elements may be combined with the configurations in the above embodiments, and the present disclosure is not limited to the configurations shown herein. In this respect, it is possible to make changes within the range without departing from the gist of the present disclosure. It is also possible to determine appropriately according to the application form.

The invention claimed is:
1. A film forming apparatus, comprising:
 a processing chamber connected to a ground potential;
 a holder configured to hold a target configured to emit sputter particles;
 a DC power supply configured to apply a DC voltage to the holder;

an anti-adhesion shield disposed to surround the target and supported by the processing chamber through an insulating member, with the sputter particles emitted from the target adhering to the anti-adhesion shield;

an impedance matcher connected to the anti-adhesion shield; and an RF power supply connected to the impedance matcher, wherein the impedance matcher is configured to perform impedance matching so that electrical resistance of the anti-adhesion shield and a film formed on the anti-adhesion shield is reduced in an electrical circuit in which current flows from plasma formed in the processing chamber to a set potential through the anti-adhesion shield.

2. The film forming apparatus of claim 1, wherein the RF power supply is configured to apply RF power having a frequency within a range of 400 kHz or more and 100 MHz or less and having 50 W or more and 10 kW or less.

3. The film forming apparatus of claim 1, wherein the insulating member is attached to a surface of the processing chamber and the anti-adhesion shield that surrounds the target is in contact with the insulating member.

4. The film forming apparatus of claim 2, wherein the surface of the processing chamber is an inclined surface of a pyramid shaped portion of the processing chamber.

5. A film forming apparatus, comprising:

a processing chamber connected to a ground potential;

a holder configured to hold a target configured to emit sputter particles;

an RF power supply configured to apply an RF voltage to the holder;

an anti-adhesion shield disposed to surround the target and supported by the processing chamber through an insulating member, with the sputter particles emitted from the target adhering to the anti-adhesion shield;

a variable coil connected to the anti-adhesion shield; and a capacitor connected to the variable coil, wherein an inductance of the variable coil is adjusted so that electrical resistance of the anti-adhesion shield and a film formed on the anti-adhesion shield is reduced in an electrical circuit in which current flows from plasma formed in the processing chamber to a set potential through the anti-adhesion shield.

* * * * *